(12) United States Patent
Murji et al.

(10) Patent No.: US 7,760,027 B2
(45) Date of Patent: Jul. 20, 2010

(54) POWER AMPLIFIER OUTPUT VOLTAGE REDUCTION METHOD

(75) Inventors: Rizwan Murji, Chicago, IL (US); Mitchell R. Blozinski, Lake in the Hills, IL (US); Rodney W. Hagen, Lake in the Hills, IL (US)

(73) Assignee: Motorola, Inc., Schaumburg, IL (US)

( * ) Notice: Subject to any disclaimer, the term of this patent is extended or adjusted under 35 U.S.C. 154(b) by 111 days.

(21) Appl. No.: 12/117,383

(22) Filed: May 8, 2008

(65) Prior Publication Data

US 2009/0278610 A1 Nov. 12, 2009

(51) Int. Cl.
H02H 7/20 (2006.01)
(52) U.S. Cl. ...................... 330/298; 330/207 P
(58) Field of Classification Search ................ 330/298, 330/207 P, 10, 302
See application file for complete search history.

(56) References Cited

U.S. PATENT DOCUMENTS

| | | | |
|---|---|---|---|
| 5,426,395 A | 6/1995 | Cygan | |
| 6,580,119 B1 | 6/2003 | Hsieh | |
| 6,580,318 B2 | 6/2003 | Taylor | |
| 6,580,321 B1 | 6/2003 | Arell | |
| 7,248,109 B2 | 7/2007 | Burns | |
| 7,486,144 B2 | 2/2009 | Mitzlaff | |
| 2007/0024372 A1 | 2/2007 | Hagen | |
| 2007/0126505 A1* | 6/2007 | Bockelman et al. | 330/252 |
| 2007/0176688 A1 | 8/2007 | Frei et al. | |
| 2007/0236295 A1* | 10/2007 | Delano | 330/302 |

* cited by examiner

*Primary Examiner*—Henry K Choe
(74) *Attorney, Agent, or Firm*—Anthony P. Curtis

(57) ABSTRACT

An apparatus and method are provided for reducing the output voltage in a power amplifier. The power amplifier contains a power supply, an amplifier stage, an impedance matching circuit, and a voltage reduction unit connected between the power supply and the amplifier stage. A power amplifier device within the amplifier stage has a gain bandwidth that covers multiple frequency bands. The output voltage of the power amplifier device is a composite voltage that contains fundamental and harmonic components that lie within the gain bandwidth. The voltage reduction unit reduces the supply voltage of the power amplifier device such that the composite output voltage is less than the breakdown voltage in the power amplifier device. The impedance matching circuit is coupled to the power amplifier device output and provides impedance matching for output signals of the fundamental and harmonic frequencies.

21 Claims, 10 Drawing Sheets

US 7,760,027 B2

POWER AMPLIFIER OUTPUT VOLTAGE REDUCTION METHOD

TECHNICAL FIELD

The present application relates to a power amplifier. In particular, the application relates to output voltage reduction in a power amplifier to prevent destruction of the power transistor(s) disposed therein.

BACKGROUND

Radio frequency (RF) power amplifiers are used in a wide variety of communications and other electronic applications, such as cellular handsets and base radio repeaters. Power amplifiers typically have several cascaded amplifier stages, each of which is formed from one or more power transistors. An amplifier stage may contain a discrete transistor, or a power integrated circuit (IC) as the primary active device. The terms RF power amplifier device, power amplifier device, transistor, power IC, or IC are used interchangeably herein to describe a device that contains one or more power transistors.

Recent technological advances of power amplifiers have increased the operational frequency bandwidth of the power amplifiers to accommodate a broader range of applications. A single exemplary 2 GHz power amplifier or power amplifier transistor of sufficient bandwidth can be used in designs for some or all of: the GSM 450, 480, 850, and 900 MHz bands; the SMR iDEN 800 MHz band; AMPS, GSM, IS-95 (CDMA), IS-136 (D-AMPS) Cellular band; GSM, IS-136 (D-AMPS) PCS band; and 3 G AWS bands in the 700 MHz range and at 1432-1435, and 1710-1755 MHz. Other bands, such as those below the 450 MHz range may also be amplified. Companies that develop products for applications that span several frequency bands may, for reasons such as cost or volume considerations, desire to use a single power amplifier in multiple products.

Although power amplifiers have maximum rated output voltage levels, these levels can be exceeded even under nominal operating conditions if proper design precautions or protection elements are not utilized. The term output voltage as used herein refers to the voltage across the drain and source of a field-effect transistor (FET) or the collector and emitter of a bipolar junction transistor (BJT). Exceeding the maximum output voltage levels could result in undesirable consequences such as device failure, rendering the power amplifier partially or fully disabled, or compromised personal safety due to fire. The maximum rated output voltage levels can be exceeded, for example, if an output network connected to the power amplifier is not optimally impedance matched to the power amplifier, or if an RF overdrive event occurs. An RF overdrive event is defined by abnormally high RF input power to the power amplifier.

An RF overdrive event may occur when the power amplifier amplifies an input signal of a sufficiently low fundamental frequency. More specifically, when the power amplifier amplifies signals at sufficiently low fundamental frequencies below the maximum operating frequency of the power amplifier, one or more harmonics of the fundamental frequency can lie within the operational bandwidth of the power amplifier device. Harmonics are herein defined as integer multiples of the fundamental frequency. The contributions of the harmonics to the composite output voltage containing the fundamental and harmonic voltage components can be significant and can result in exceeding the maximum rated output voltage of the transistor even at nominal power levels within the rating of the device. Especially in power amplifiers to be used in applications that span several frequency bands, the gain bandwidth of the power amplifier may be limited to a narrow band of operation yet still be prone to the device failure if the device gain is of sufficient bandwidth to contain harmonics. As above, this can result in permanent damage to the device or decrease the product life.

For an exemplary VHF band of 150 to 174 MHz, a 1 GHz operational bandwidth device includes harmonic frequencies through the $6^{th}$ harmonic of the fundamental. The peak output voltage can be notably affected by any or all of these frequency components. If the resulting voltage waveforms of multiple frequency components lie in phase with respect to one another, the composite peak output voltage can increase significantly over that of the fundamental frequency component alone.

In applications such as base station transmitters it is further desirable to linearize the output of the power amplifier. One common technique to maintain linearization of the power amplifier uses Cartesian feedback. Training sequences are performed periodically over the lifetime of the system to condition the feedback loop for the gain and phase of the feedback signal so that the loop maintains stable operation. An RF overdrive event can occur when the Cartesian feedback becomes unstable, which may occur due to software glitches and/or hardware performance. The instability results from a change in loop dynamics occurring between loop training sequences. These loop-instabilities can occur at various points throughout the lifetime of the system due to internal influences, such as age-based changes in the individual devices within the loop, or external influences, such as changes in the ambient temperature. In order to meet linearity requirements, gain stages in the transmitter typically have saturated power levels above that required for nominal average power operation. Because of this, a loop-instability can produce abnormal drive levels to a given amplifier stage due to the headroom of the preceding amplifier. If proper precautions are not taken when designing the power amplifier, failure of one or more of the elements contained within the power amplifier may occur when an RF overdrive event causes the instantaneous output voltage on an RF power device to exceed its breakdown voltage.

BRIEF DESCRIPTION OF THE DRAWINGS

Embodiments will now be described by way of example with reference to the accompanying drawings, in which.

DETAILED DESCRIPTION

An apparatus and method are provided for reducing the output voltage in a power amplifier. The operational peak output voltage of the power amplifier is lowered under normal operating conditions and/or the peak output voltage of the power amplifier is reduced during an RF overdrive event. The power amplifier contains one or more amplifier stages, each having one or more devices in serial or parallel combinations. A voltage reduction unit is connected to at least one device within an amplifier stage. The voltage reduction unit limits the supply voltage of the device within the amplifier stage to which it is connected such that the supply voltage is at most a predetermined maximum supply voltage. The supply voltage is limited such that the output voltage of the device is less than the breakdown voltage of the device.

The voltage reduction unit may either provide a fixed reduced supply voltage to the device, an adjustable reduced supply voltage to the device, an input voltage that is dependent voltage reduction unit, or may be a current controlled voltage reduction circuit. An example of a fixed reduced supply voltage unit to the device is a linear regulator or switching regulator; of an adjustable reduced supply voltage is a linear or switching regulator controlled by a sensing circuit; of an input voltage dependent voltage reduction unit is a voltage divider circuit; of a current controlled voltage reduction circuit is a simple series resistive element that results in a larger voltage drop to the device with increased current draw by the device. If the reduced supply voltage is provided by an adjustable voltage reduction unit, the reduction in voltage may be set by software (SW) or hardware (HW) controlled circuitry. The control of the adjustable voltage reduction unit can be of a static nature (set to a single point) or dynamic (changing in response to an external stimulus). Dynamic control of the voltage reduction unit, for example, can be performed via a sensing circuit used to sense an input or output parameter (e.g., peak power) of one or more of the amplifier stages and reduce the supply voltage accordingly. A current reduction unit that limits the supply current rather than the supply voltage may also be used.

An amplifier stage contains one or more field effect transistors (FETs), such as a laterally diffused metal-oxide semiconductor (LDMOS), or bipolar junction transistors (BJTs), such as a heterojunction bipolar junction transistor (HBT). A supply voltage supplied to the amplifier stage is provided between the source and drain of the FET or between the emitter and collector of the BJT forming the amplifier stage. The power amplifier may be formed on a circuit board from separate components or may be formed in an integrated circuit.

Figure 1:
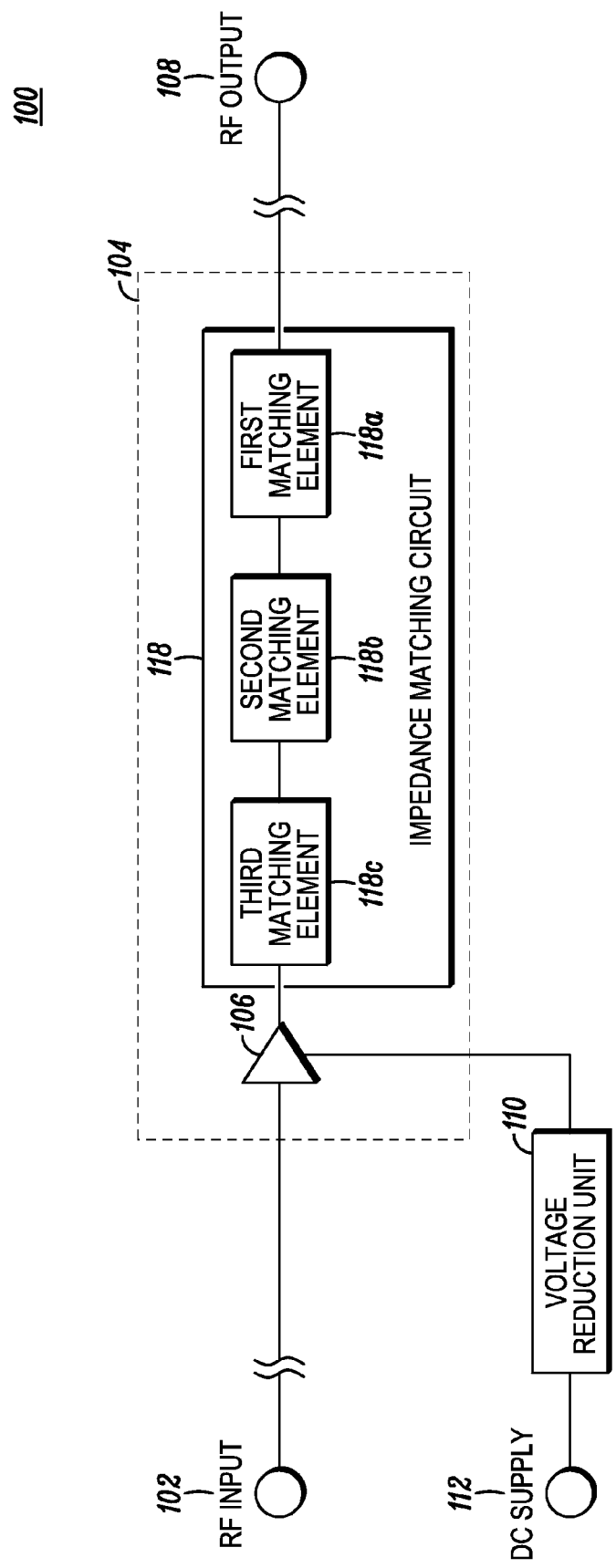
FIG. 1 illustrates one embodiment of a power amplifier.

One embodiment of a power amplifier is shown in FIG. 1. The power amplifier 100 contains an amplifier stage 104, to which an RF input 102 is supplied and which provides an RF output 108. The amplifier stage 104 contains a power amplifier device 103 and an impedance matching circuit 118. The RF input 102 can have a fundamental (lowest) frequency of operation within the gain bandwidth of the amplifier stage 104. The gain bandwidth of the power amplifier can contain multiple harmonics dependent on the fundamental frequency of the RF input 102. A voltage reduction unit 110 is connected to the power amplifier device 103 in the amplifier stage 104. The voltage reduction unit 110 reduces a DC supply voltage 112 supplied to the power amplifier 100 and this reduced voltage is supplied to the power amplifier device 103. The DC supply voltage 112 may be provided from any known voltage supply. The DC voltage supply 112 is, for example, 29V for an exemplary base station transmitter.

An impedance matching circuit 118 is disposed at the output of the power amplifier device 103. The impedance matching circuit 118 provides an optimized impedance match for desired frequencies within the bandwidth of the amplifier stage 104. Thus, the impedance matching circuit 118 can contain multiple matching elements including a first matching element 118a for the fundamental component of the output voltage, a second matching element 118b for the first harmonic component of the output voltage, a third matching element 118c for the second harmonic component of the output voltage, etc. . . . Matching elements 118a, 118b, 118c, etc. . . . can be in any order. This is true of all impedance matching circuits shown in FIGS. 1-7; they are each designed to provide an optimized impedance matching for not only the fundamental frequency of the amplifier as is the typical focus of designing such a matching circuit, but also for all harmonic frequencies of the fundamental frequency within the operational bandwidth of the transistors comprising the particular amplifier stage. Details of such an impedance matching circuit can be found in U.S. patent application Ser. No. 11/345,573, filed Feb. 1, 2006, and entitled "Method And Apparatus For Controlling An Output Voltage In A Power Amplifier," which is herein incorporated by reference in its entirety. As used herein, gain bandwidth is defined as the full width at half maximum (FWHM) of the logarithmic gain, measured in dB.

Other known elements may exist in the RF path before and after the amplifier stage 104. These elements, such as additional amplifier stages, are not shown for convenience but are instead represented by the breaks in the RF path of FIGS. 1-7. In addition, other known elements may exist in the amplifier stage 104, but are not shown for convenience.

Figure 2:
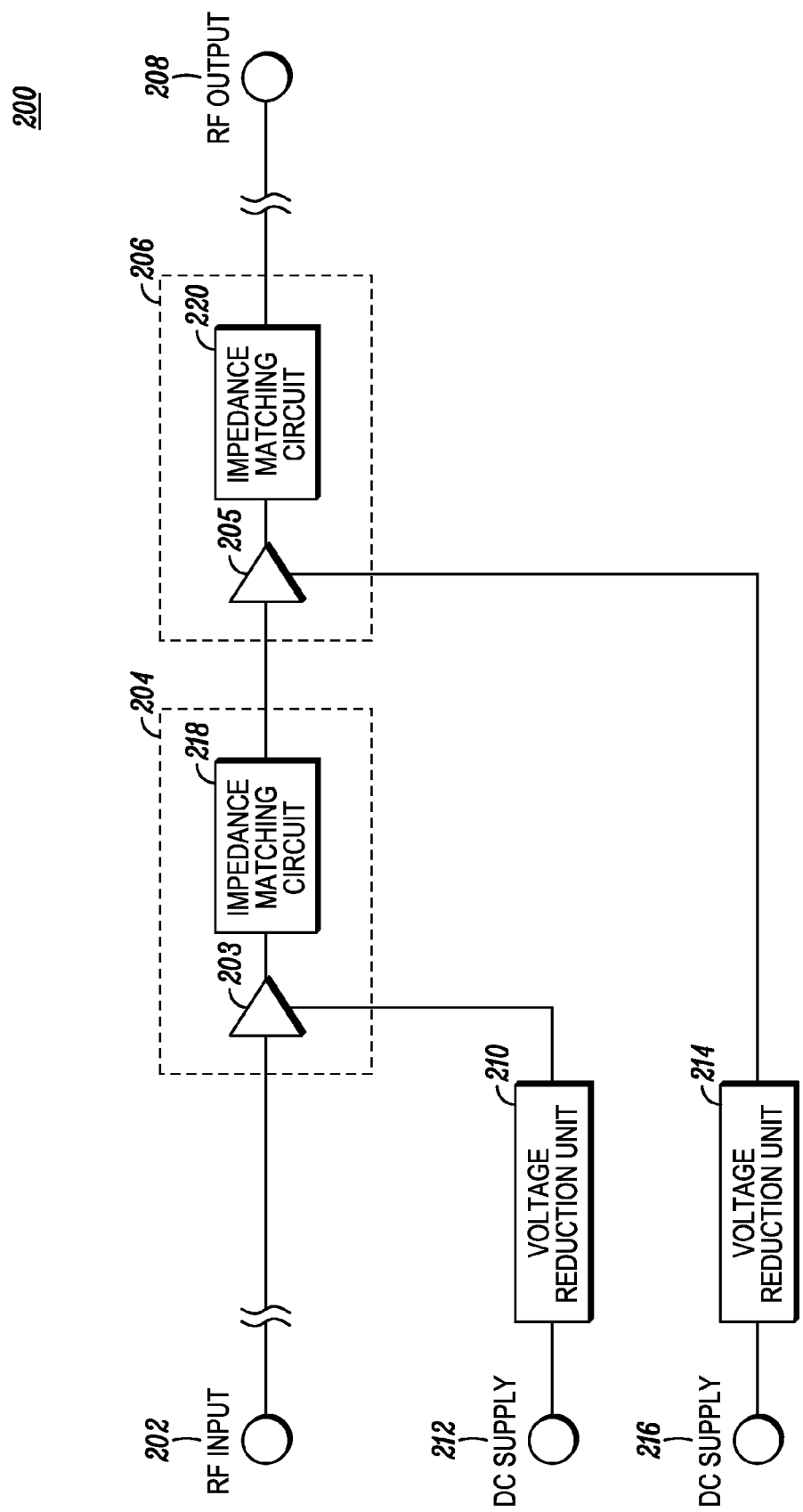
FIG. 2 illustrates another embodiment of a power amplifier.

Another embodiment of a power amplifier is shown in FIG. 2. The power amplifier 200 contains multiple cascaded amplifier stages 204, 206 to which an RF input 202 is supplied and which provides an RF output 208. Each amplifier stage 204, 206 contains a power amplifier device 203, 205 and an impedance matching circuit 218, 220. A voltage reduction unit 210 is connected to the input power amplifier device 203 in the input amplifier stage 204 to which the RF input 202 is connected. The voltage reduction unit 210 reduces the supply voltage from a DC voltage supply 212 and the reduced voltage from the DC voltage supply 212 is supplied to the input power amplifier device 203. A voltage reduction unit 214 is connected to the final power amplifier device 205 in the final amplifier stage 206 that supplies the RF output 208. The voltage reduction unit 214 reduces the supply voltage from the DC voltage supply 216 and the reduced voltage from the voltage reduction unit 214 is supplied to the final power amplifier device 205. The DC voltage supplies 212, 216, as above, may be formed from any known voltage supply. The impedance matching circuit 218 provides an optimized impedance match between the input impedance of the power amplifier device 205 and the output impedance of the power amplifier device 203 for desired frequencies within the bandwidth of the power amplifier device 203. Similarly, the impedance matching circuit 220 provides an impedance match between the impedance of the RF output 208 and the impedance of the output of the power amplifier device 205 for desired frequencies within the bandwidth of the power amplifier device 205. Although two supply voltages 212, 216 are shown in FIG. 2, a single voltage supply may be provided as an input to both the first and second voltage reduction units 210, 214. The voltage reduction units 210, 214 may be the same type of reduction unit or different types of units as described below.

Figure 3:
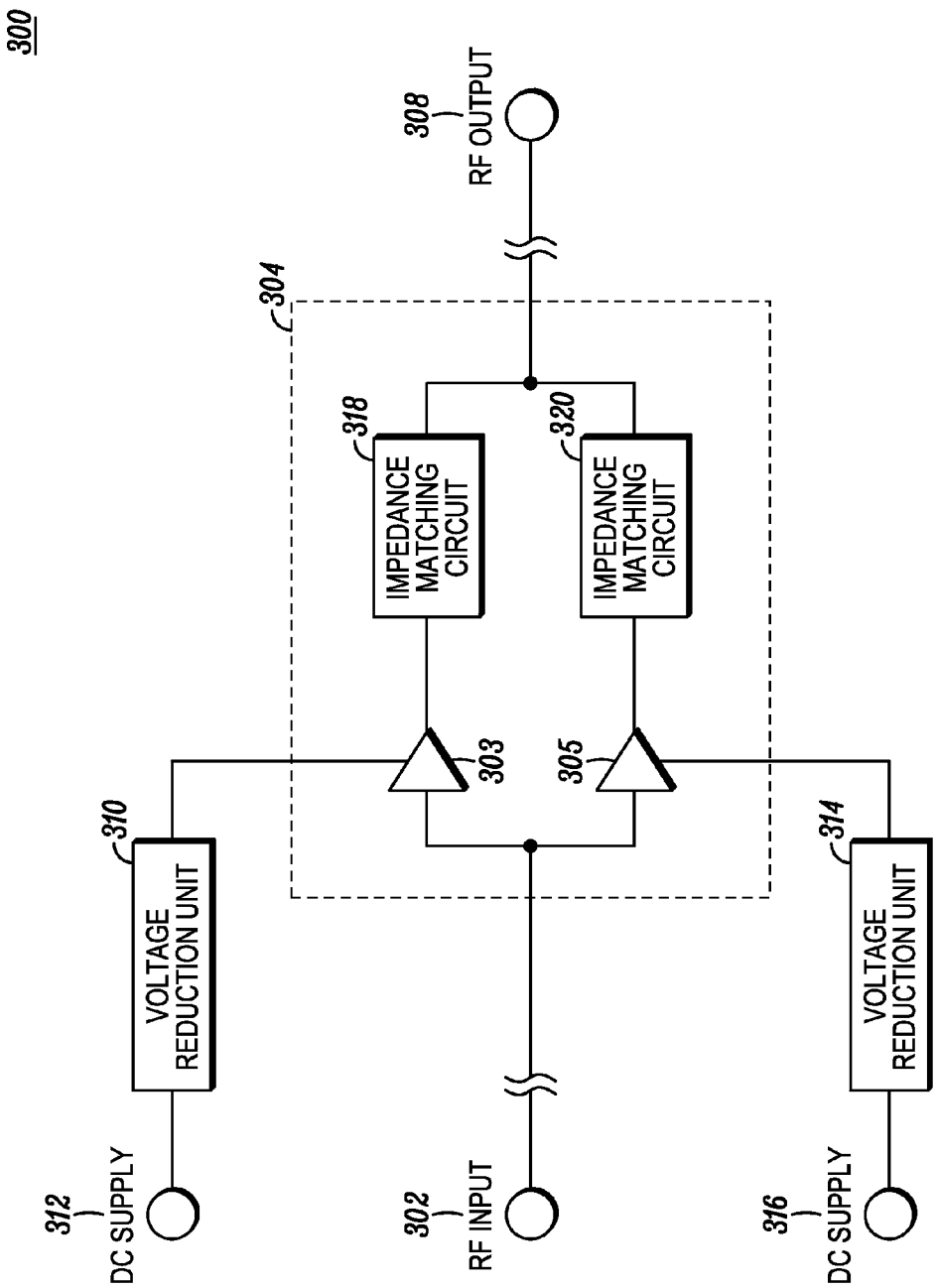
FIG. 3 illustrates another embodiment of a power amplifier.

Another embodiment of a power amplifier is shown in FIG. 3. The power amplifier 300 contains a power amplifier stage 304 that includes multiple parallel power amplifier devices 303, 305 to each of which is provided an RF input 302 and each of which provide an RF output 308. Voltage reduction units 310, 314 are connected to the parallel power amplifier devices 303, 305, respectively. The voltage reduction units 310, 314 reduce the supply voltage from a DC voltage supply 312, 316, respectively, and the reduced voltage is supplied to the respective parallel power amplifier devices 303, 305. Impedance matching circuits 318, 320 provide an optimized impedance match between the RF output 308 and the output of the respective power amplifier devices 303, 305 for desired frequencies within the bandwidth of the power amplifier devices 303, 305 as described above. Although only two parallel power amplifier devices are shown in the amplifier stage of FIGS. 3 and 4, other parallel power amplifier devices may be present in the amplifier stage 304.

Figure 4:
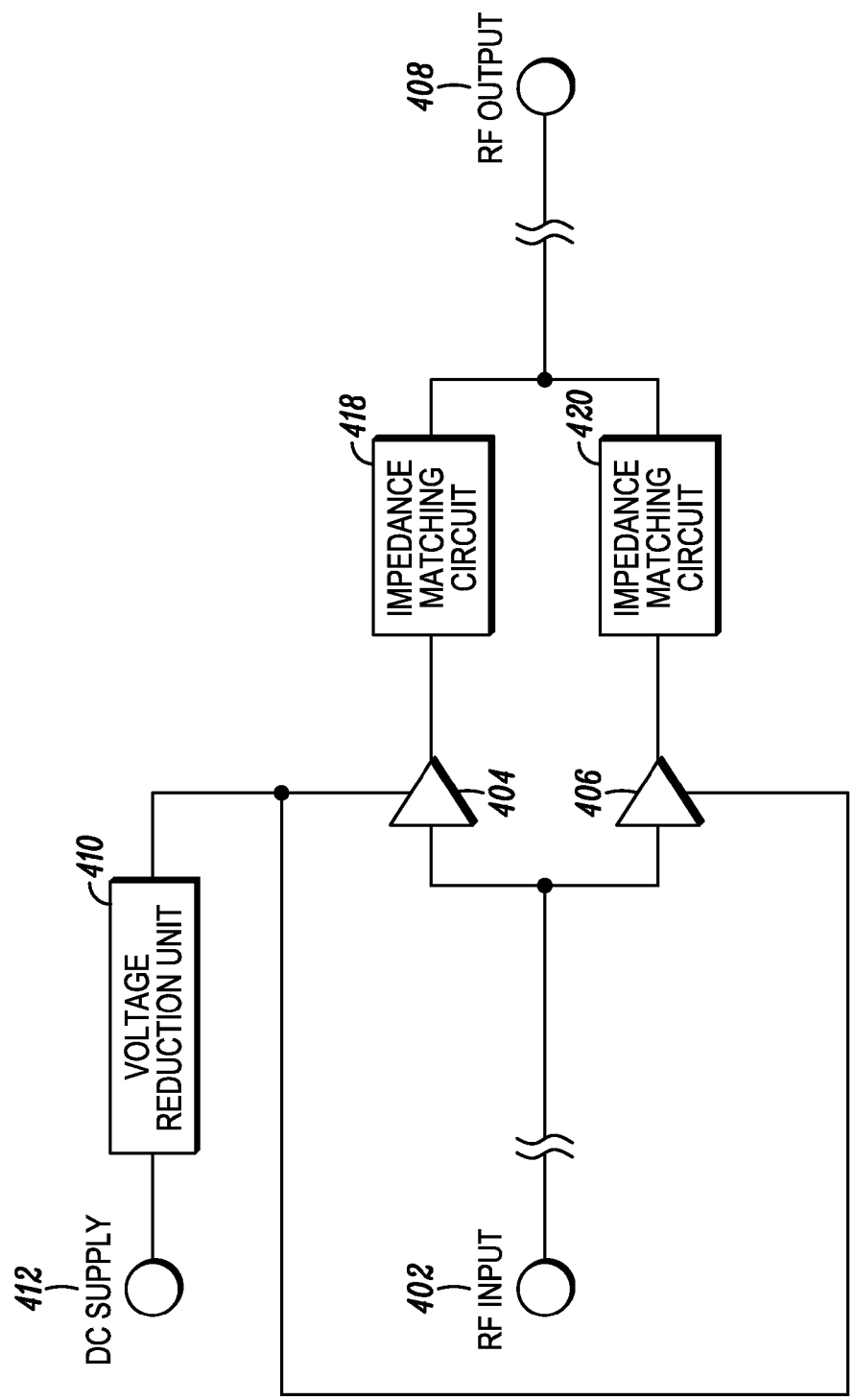
FIG. 4 illustrates another embodiment of a power amplifier.

In other embodiments, the same voltage reduction unit can be used for multiple series and/or parallel amplifier stages. For example, in the power amplifiers 200, 300 of FIGS. 2 and 3, a common voltage reduction unit could supply power to multiple amplifier stages. Such an embodiment is shown in FIG. 4. The power amplifier 400 shown in FIG. 4 depicts a common voltage reduction unit 410 for two parallel power amplifier devices 404, 406. The other components in the power amplifier 400 (e.g., impedance matching circuits 418, 420) are identical in function to those in the power amplifier 300 of FIG. 3.

Figure 5:
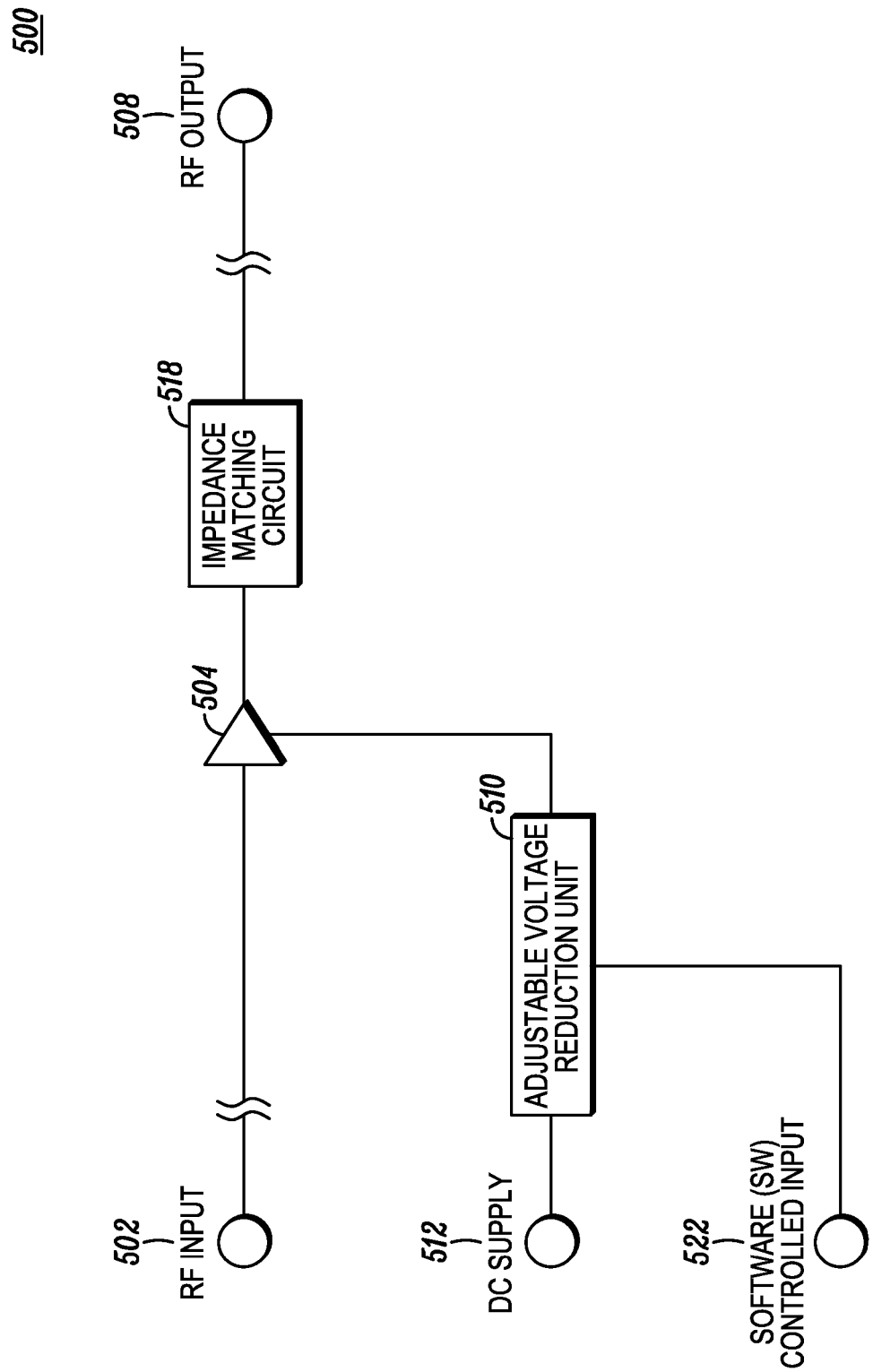
FIG. 5 illustrates another embodiment of a power amplifier.

FIG. 5 illustrates another embodiment of a power amplifier. In this embodiment, the power amplifier 500 utilizes an adjustable voltage reduction unit 510 to reduce the supply voltage of the DC supply 512 to the amplifier stage 504. Control of the adjustable voltage reduction unit 510 is effected by a software (SW) input 522 to the power amplifier 500. The parameters that dictate the software operation can, for example, be predefined based on the peak output power of the power amplifier 500. The impedance matching circuit 518 operates in a manner similar to that described above.

Figure 6:
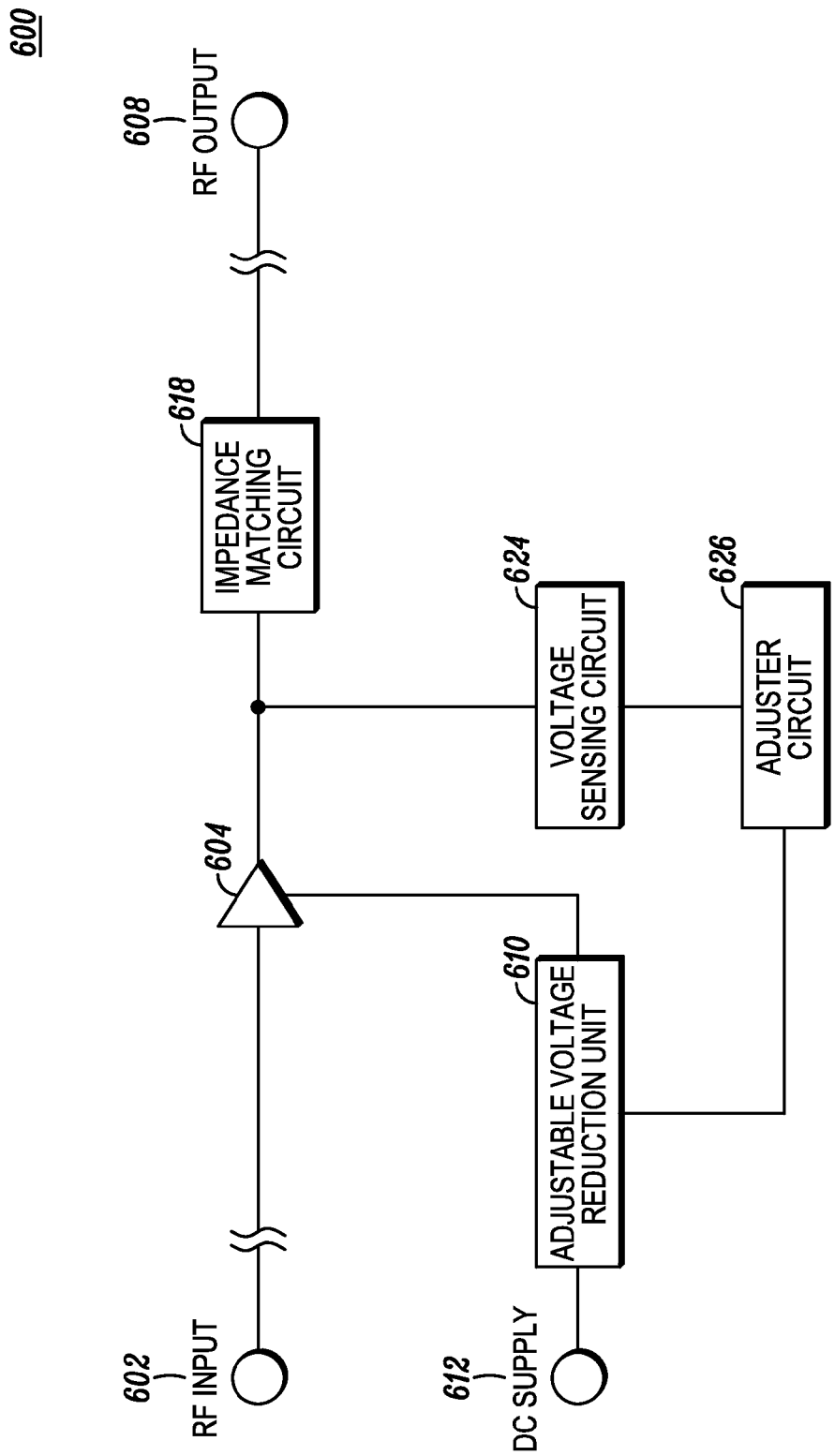
FIG. 6 illustrates another embodiment of a power amplifier.

FIG. 6 is illustrates another embodiment of a power amplifier. As in the embodiment of FIG. 5, the power amplifier 600 utilizes an adjustable voltage reduction unit 610 to reduce the supply voltage of DC supply 612 to the power amplifier device 604. A voltage sensing circuit 624 is connected to the output of the power amplifier device 604 and monitors the peak output voltage of the power amplifier device 604. The voltage sensing circuit 624 may, for example, contain a high impedance voltage divider circuit provided in close proximity to the output of the power amplifier device 604. An adjuster circuit 626 controls the adjustable voltage reduction unit 610. The adjuster circuit 626 is connected to the voltage sensing circuit 624. The adjuster circuit 626 may, for example, include a comparator circuit that compares the output of the voltage sensing circuit 624 to that of a predefined static voltage. When the peak output voltage of the power amplifier device 604 exceeds a predefined limit, as detected by the voltage sensing circuit 624, this event is signaled to the adjuster circuit 626. The adjuster circuit 626 then controls the adjustable voltage reduction unit 610, which in turn reduces the supply voltage to the power amplifier device 604. The impedance matching circuit 618 operates in a manner similar to the impedance matching circuits of other figures.

Note that while the sensing circuitry described in FIG. 6 may be effective, there are several disadvantages to using these circuit elements. Such circuitry adds cost and design complexity and often uses non-standard components for the circuit to operate correctly. There are increased reliability risks due to the additional circuit elements, which adds to the risks of malfunction of the reacting circuits and could impact device reliability. Moreover, there exist timing concerns on detecting the event and reacting in time to prevent amplifier stage failure. The circuitry should be disposed as close as possible to the output of the amplifier stage to enable the power amplifier to react in time to the event. When space is limited, however, it may be difficult to place the sensing circuitry close to the amplifier stage output as it may be more desirable to locate other circuitry in the location, e.g., circuitry for impedance matching purposes. Although the voltage sensor is connected to the output of the power amplifier device in FIG. 6, the voltage sensor could be connected to the input. However, in this case it may be more difficult to obtain a composite voltage of the harmonic and fundamental frequency components compared to when the voltage sensor is the output. Also, it may be more problematic to account for gain differences due to device to device variation if the voltage sensor is connected to the input. These problems may be taken into account by further lowering the predefined limit, thereby limiting the allowed output power of the amplifier stage. However, further lowering the predefined limit may lower the effective peak power capability in comparison to sensing the voltage on the output as shown in FIG. 6.

Figure 7:
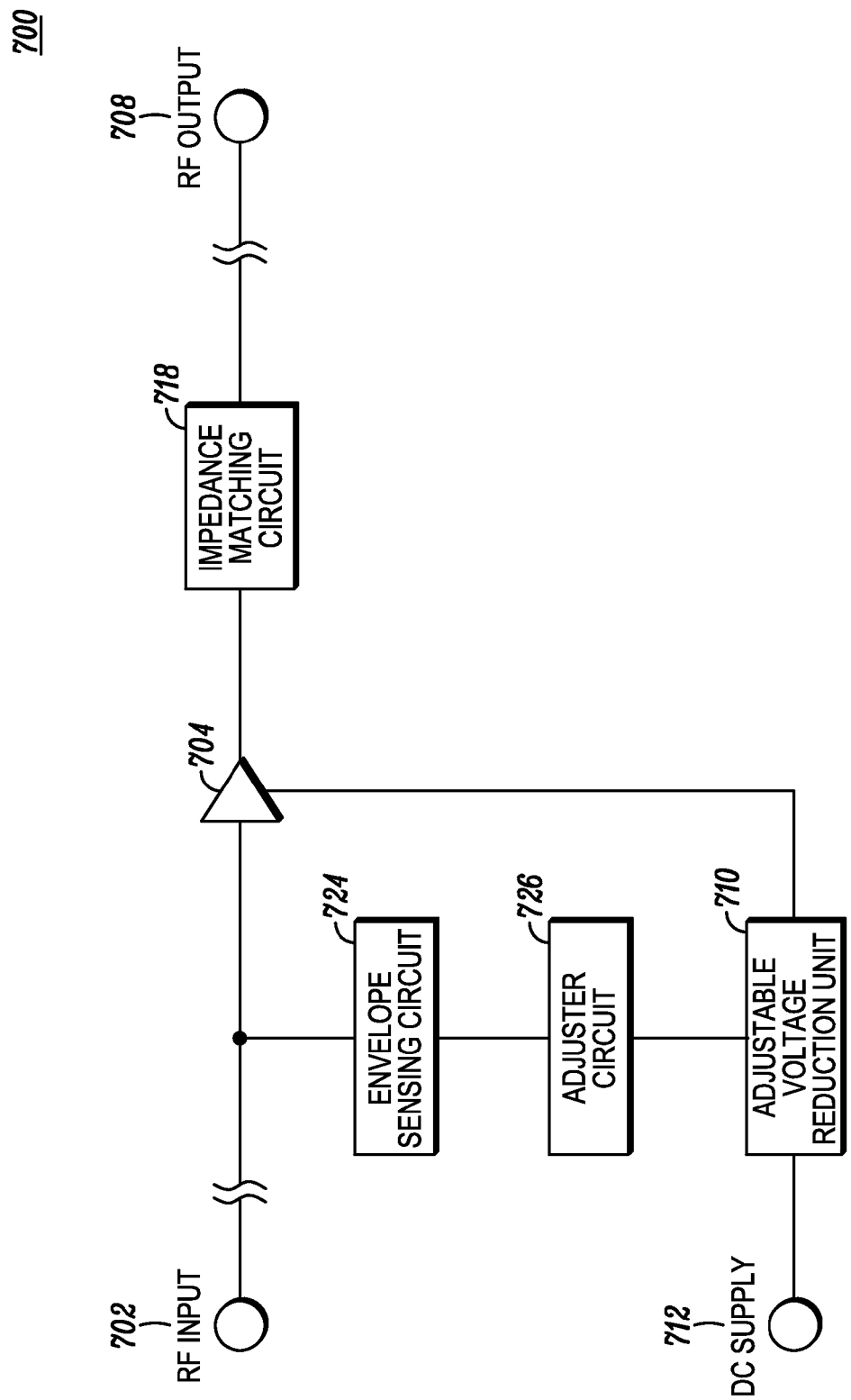
FIG. 7 illustrates another embodiment of a power amplifier.

Another embodiment of a power amplifier is shown in FIG. 7. This power amplifier 700 is similar to that shown in FIG. 6, with the exception that control of the adjustable voltage reduction unit 710 is provided by sensing the input voltage of the power amplifier device 704 rather than the output voltage of the power amplifier device 704. Specifically, the embodiment of FIG. 7 includes an envelope sensing circuit 724 that detects the envelope of the RF input 702 rather than the output of the power amplifier device 704. The envelope sensing circuit 724 may, for example, include a high impedance voltage divider circuit. The output of the envelope sensing circuit 724 is connected to the adjuster circuit 726. The adjuster circuit 726 may be an operational amplifier, for example, with an output that is dependent on the peak RF input power to the power amplifier device 704 as sensed by the envelope sensing circuit 724. As the RF envelope peak increases, the adjuster circuit 726 controls the adjustable voltage reduction unit 710 such that the amount of voltage reduction provided by the adjustable voltage reduction unit 710 decreases, yielding a higher supply voltage to the power amplifier device 704. Similarly, as the RF envelope peak decreases, the adjuster circuit 726 controls the adjustable voltage reduction unit 710 such that the amount of voltage reduction provided by the adjustable voltage reduction unit 710 increases, yielding a lower supply voltage to the power amplifier device 704. A maximum adjustable level may, for example, be incorporated in the envelope sensing circuit 724 such that peak envelope power levels above a predefined threshold yield no further increase in supply voltage to the power amplifier device 704 as supplied by the adjustable voltage reduction unit 710.

In an alternative embodiment, the envelope sensor may be connected to the input of the power amplifier device in FIG. 7. However, in such an embodiment, it may be more difficult to obtain a composite voltage of the harmonic and fundamental frequency components than using an output sensor, and it also may be more problematic to account for gain differences due to device to device variation. To prevent amplifier device failures due to these deficiencies, techniques could be employed as described in FIG. 6, in regards to the FIG. 6 alternate embodiment of placing the voltage sensor on its input. Also, note that the envelope following characteristics of FIG. 7 may be degraded if the envelope sensor is alternately connected to the output, which in turn may result in lower operating efficiencies due to the extra headroom desired to prevent premature clipping of the output waveform.

Generally, the voltage reduction units in FIGS. 1-7 can be non-adjustable (also referred to as static), adjustable (also referred to dynamic), current dependent, or input voltage dependent. All of these types of voltage reduction units may contain active or passive circuits, or a combination thereof. An input voltage dependent voltage reduction unit may contain, for example, a simple voltage divider circuit. A current dependent voltage reduction unit may, for example, provide an amount of voltage reduction dependent on the current drawn by the power amplifier device. More specifically, a current dependent voltage reduction unit limits the power supply current such that the amplifier supply current is less than a predetermined destructive supply level current and the amplifier output current is less than a predetermined destructive output current level. A static voltage reduction unit may fix the output voltage at a nominally constant level regardless of the input voltage level (within a specified range) supplied by the input DC supply. The voltage reduction unit may be adjustable and provide a variable reduced supply voltage to a power amplifier device, for example, depending on the peak input power provided to that power amplifier device. In some circumstances the voltage reduction unit may be adjustable yet maintain the supply voltage from the DC power supply rather than reducing it for certain predefined conditions, such for a pulse-width-modulated switching supply operating at 100% duty cycle. The input DC supply voltage typically is higher than that of the output voltage of the voltage reduction unit but is not required to be, such as for a step-up voltage converter. The voltage reduction unit is referred to as a voltage "reduction" unit as that is typically how it will be used, but it could also be a voltage "increasing" unit.

A non-adjustable circuit, as used herein, is a circuit in which the output voltage for a given input voltage cannot be altered unless the circuit itself or elements in the circuit are physically replaced or altered (e.g., by soldering). An adjustable circuit, as used herein, is a circuit in which the output voltage for a given input voltage can be altered via an external stimulus such as a sensor or software controlled circuit with no physical component changes.

One type of non-adjustable voltage reduction unit is a linear voltage regulator with an output voltage of, for example, 25V for a 29V supply voltage. One type of adjustable voltage reduction unit may be a buck converter switching voltage reduction unit with a reduced output voltage of, for example, 21-29V. The voltage reduction unit 210 may be a linear voltage regulator, while the voltage reduction unit 214 may be a buck converter, or they may also be of the same type.

A linear voltage regulator circuit may be, for example, a non-adjustable circuit with an internally derived fixed feedback network (such as an MC33275 fixed regulator) to determine the output voltage, or an adjustable linear regulator such as an LM317 adjustable regulator component with fixed (i.e. non-adjustable) resistors or a potentiometer (i.e. mechanically adjustable) making up the external feedback network in the circuit. A linear voltage regulator may also be an adjustable circuit in which an adjustable linear regulator component (such as an LM317) is used, but the feedback network of the regulator circuit is affected by an external input to the circuit such as a software controlled input voltage affecting the feedback voltage to the linear regulator component which impacts the output voltage of the linear regulator circuit.

Note that while the linear voltage regulator is relatively inexpensive and may occupy a relatively small space on a circuit board (not shown) containing the power amplifier, there are some disadvantages to using it. The linear voltage regulator is relatively inefficient, since it operates by emitting the excess power resulting from the voltage reduction as heat. Multiple linear voltage regulators may be used to decrease the supply voltage in smaller steps rather than using one linear voltage regulator for the entire voltage drop. This may use more total real estate overall compared to a single linear regulator providing the entire voltage drop, but each section can potentially take up less real estate on the circuit board containing the power amplifier than a single regulator due to the differences in areas needed for thermal dissipation in a single step vs. multiple smaller steps. The thermal dissipation of a single regulator may not be manageable due to limitations in the mechanics of the design. The linear voltage regulator voltage reduction unit may be acceptable for all of the power amplifier devices in the power amplifier or may not be desirable for some or all amplifier stages (such as the final amplifier stage) as the power consumed and heat generated may be problematic.

A buck converter is a step-down DC to DC converter, which is a switched-mode power supply that uses a combination of active and passive components including a transistor, a diode, an inductor and a capacitor. The buck converter is relatively efficient, but is typically more expensive than the linear voltage regulator circuit and will typically occupy more real estate to implement. The additional circuitry is composed of standard components, adding little or no additional risk, and used to provide voltages for a variety of locations. These components may be disposed virtually anywhere on the board containing the power amplifier or off board. It is also relatively easy to change the operation of the circuit.

The amount of voltage reduction provided by an adjustable voltage reduction unit can be defined by software parameters or hardware circuitry that is not adjustable by an outside entity such as a Base Radio (BR) customer. Alternatively, or in addition, a customer or field technician could perform adjustments to the operation of the adjustable voltage reduction unit to, for example, lower the limit of the peak output voltage capabilities of the voltage reduction unit to elongate the product lifetime if the predefined maximum output voltage of the adjustable voltage reduction unit was not entirely required for a particular application (e.g. using the BR repeater below its maximum output power rating).

Figure 8:
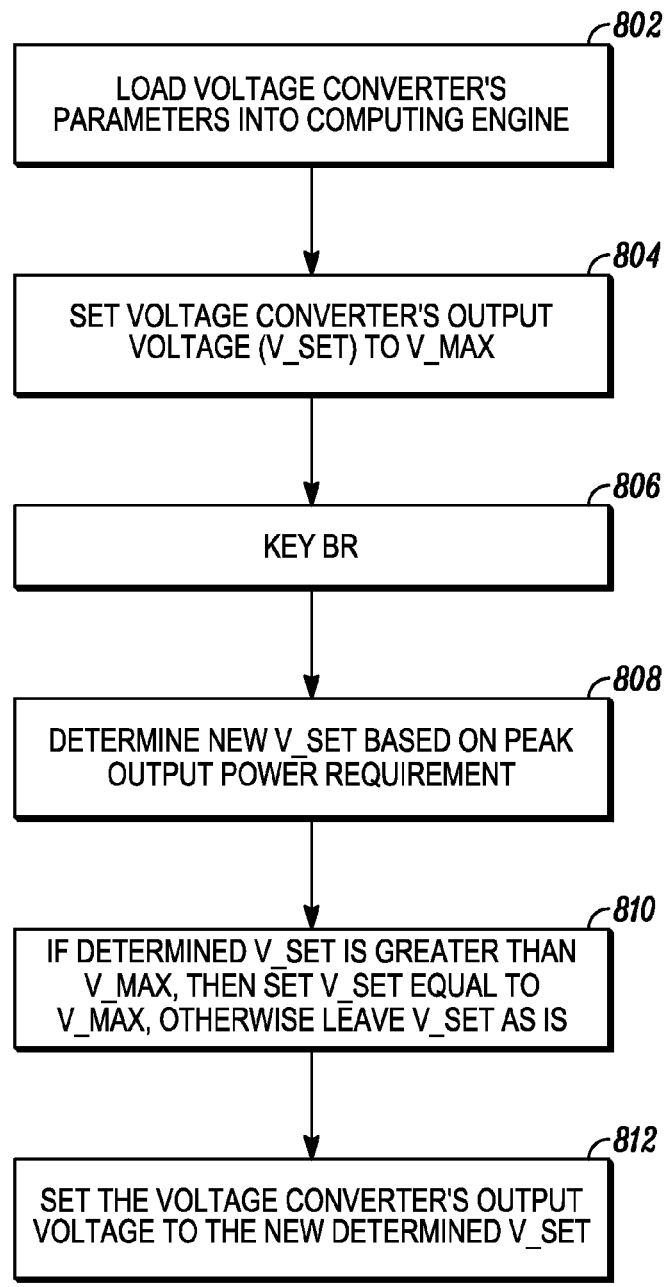
FIG. 8 is a flowchart of setting the buck converter in one embodiment.

A flowchart 800 for establishing the output voltage of the buck converter is shown in FIG. 8. Generally, the system parameters are known, including the average input voltage to the amplifier stage supplied by the buck converter. This permits determination of the minimum and maximum allowable output voltages of the buck converter and setting of the output voltage of the buck converter. Details of determining the minimum buck voltage can be found in U.S. patent application Ser. No. 11/182,043, filed Jul. 14, 2005, and entitled "Method And Apparatus For Controlling A Power Amplifier Supply Voltage," which is herein incorporated by reference in its entirety.

More specifically, in FIG. 8, default parameters of the buck converter are programmed (stored) into non-volatile memory during the manufacture of the power amplifier based on the amplifier stage characteristics and then loaded into the computing engine for later use 802. Next, the output voltage of the buck converter (V_set) is set to V_max in 804, followed by keying up the BR in 806. Based on the peak output power requirements of the modulation, the new V_set voltage is determined in 808. A comparison is then performed to determine if V_set is greater than V_max (V_set>V_max) in 810. If V_set>V_max, then V_set is set to be equal to V_max (V_set=V_max), otherwise, V_set is left as is in 810. Finally, the voltage converter's output voltage is set to the new determined V_set in 812.

Similarly, other measures may be used in addition to the supply voltage reduction circuitry. For example, the supply voltage reduction circuitry can be used in addition to a circuit that increases the level of negative feedback used in a feedback based power amplifier linearization system or in a power control feedback loop to reduce drive or gain when the output power exceeds a preset threshold level, such as that U.S. Pat. No. 5,426,395, which issued Jun. 20, 1995, entitled "Method And Apparatus For Protecting Power Amplifiers From Excessive Operating Power Levels," and U.S. Pat. No. 6,580,318, which issued Jun. 17, 2003, entitled "Method And Apparatus For Protecting RF Power Amplifiers," both of which are herein incorporated by reference in their entirety. However, such approaches detect output power, which does not directly correlate to the source of the failure mechanism—the drain voltage of the power transistor in the amplifier stage, and may have a relatively slow response time. Other sensing circuitry may be used to detect an RF overdrive event and shut down bias to the amplifier stage. However, in this case, the amplifier stage bias may accidentally be shut down if a false event registers. The time to reset the device containing the power supply may be substantial, for example 1-2 minutes, for a base station.

Figure 9:
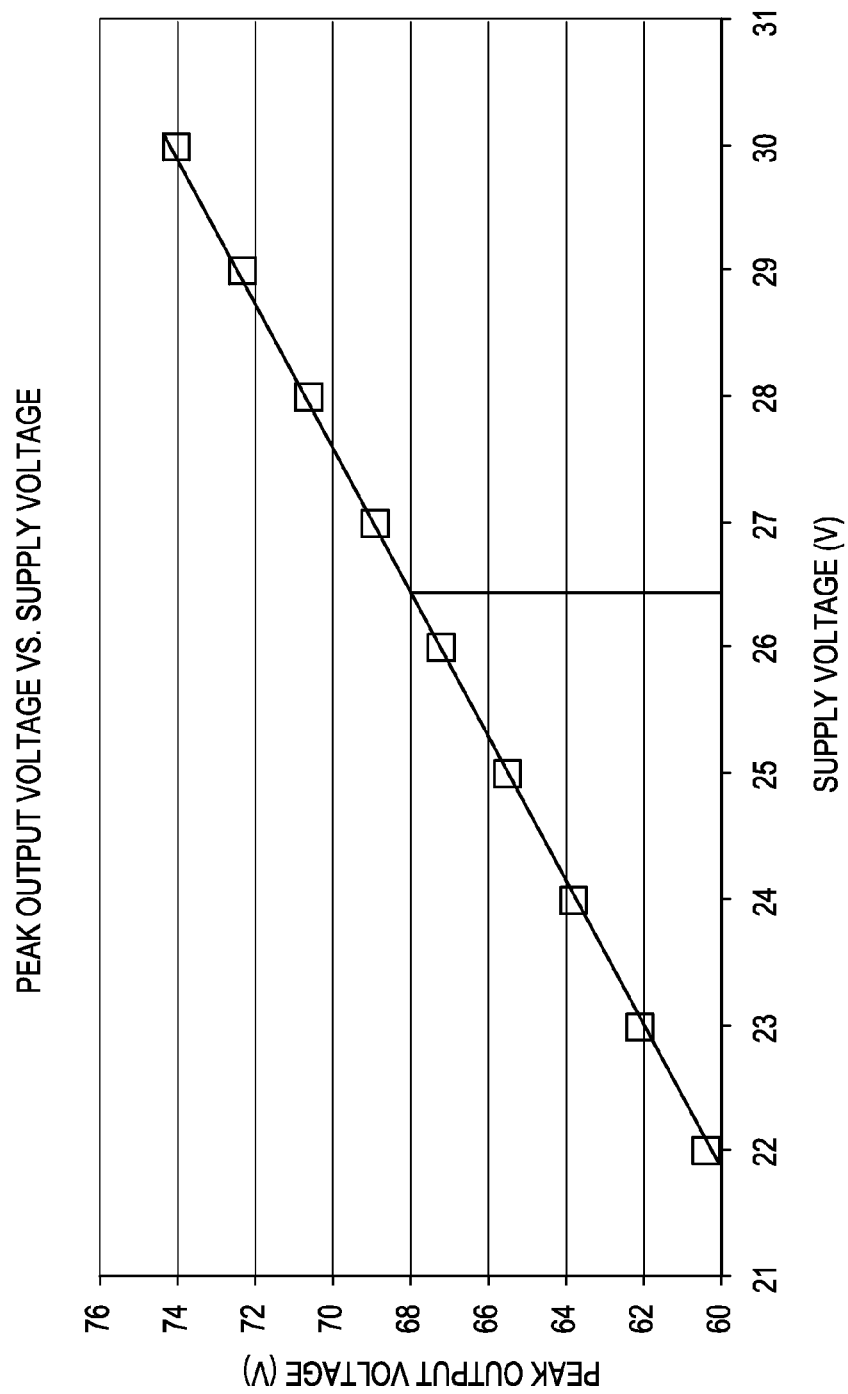
FIG. 9 is a graph of power amplifier peak output voltage vs. power amplifier supply voltage.

A simulation of the maximum output voltage of the power amplifier with respect to the supply voltage of the power amplifier is illustrated in FIG. 9. As shown, the maximum output voltage of the power amplifier reduces linearly with a reduction in the power amplifier supply voltage. The maximum supply voltage (i.e., the buck voltage) for an exemplary VHF peak output voltage of 68V is about 26.5V.

Figure 10:
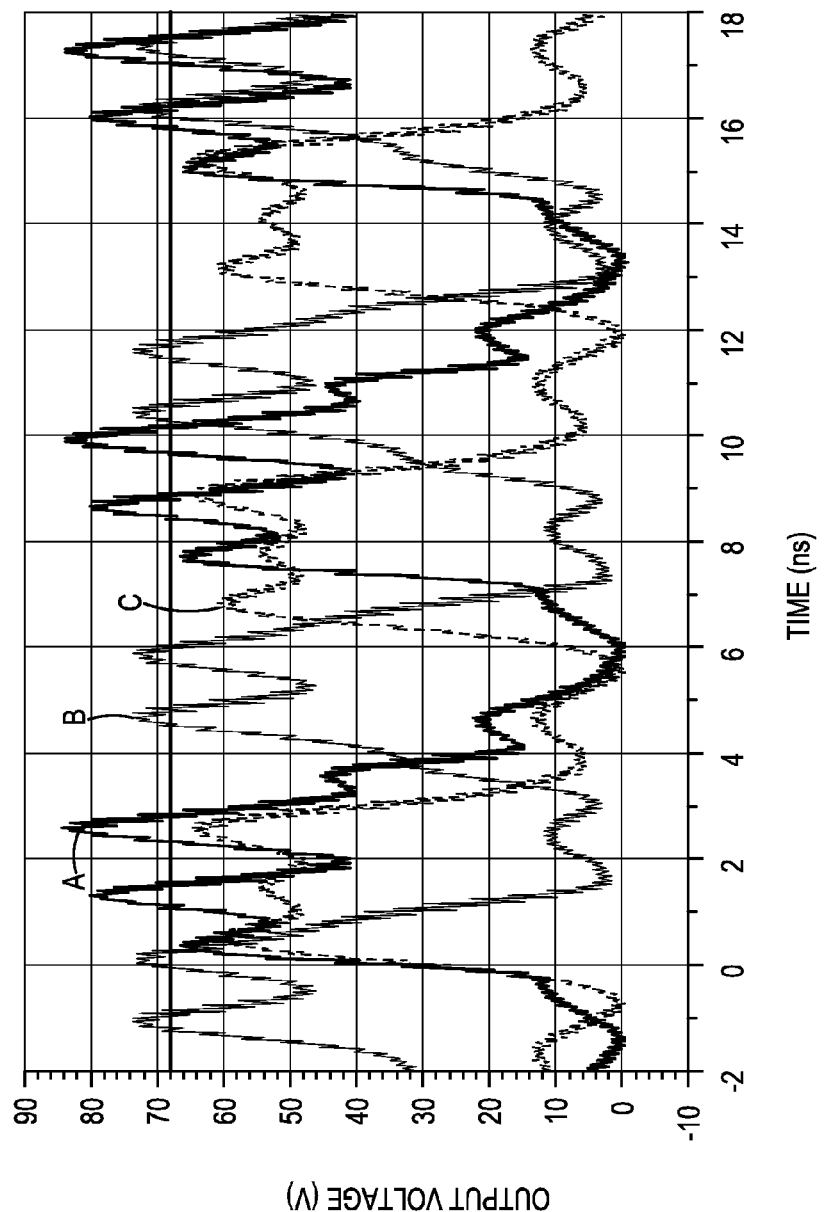
FIG. 10 is a graph showing a simulation of output voltage vs. time for different embodiments of a power amplifier.

Simulations of power amplifier output voltages vs. time are shown in FIG. 10. The input supplied to the power amplifier is a sine wave, whereas the output of the power amplifier can show signs of distortion as illustrated in FIG. 10. In FIG. 10, the simulation labeled 'A' illustrates a power amplifier in which the amplifier stage contains neither supply voltage reduction nor harmonic termination. The simulation labeled 'B' illustrates a power amplifier in which the amplifier stage contains harmonic termination but not supply voltage reduction. The simulation labeled 'C' illustrates a power amplifier in which the amplifier stage contains both supply voltage reduction and harmonic termination. The maximum rated output voltage of the power amplifier as shown is 68V. As illustrated, without either supply voltage reduction or harmonic termination, the power amplifier reaches a maximum output voltage of about 84V and exceeds the maximum rated output voltage. With harmonic termination but without supply voltage reduction, the power amplifier reaches a maximum output voltage of about 74V and again exceeds the maximum rated output voltage. With supply voltage reduction and harmonic termination, the power amplifier reaches a maximum output voltage of about 64V and does not exceed the maximum rated output voltage.

As discussed above, the power amplifier may provide amplification (gain) for input voltages over a wide frequency bandwidth. An RF overdrive event may occur and lead to failure of a power amplifier device due to harmonics of the fundamental input voltage that are within the gain bandwidth of any amplifying stage. Thus, the input signals in higher frequency bands are less likely to cause a power amplifier device failure during an RF overdrive event due to fewer, if any, harmonics being within the gain bandwidth. The reduction in the supply voltage provided by the voltage reduction unit to an amplifier stage thus may be adjusted dependent on the particular frequency band occupied by the input signals. Specifically, the voltage reduction unit may provide an increased supply voltage when input signals in an increased frequency band are applied to the amplifier band. In this case, the location of the band within the gain bandwidth of the amplifier stage (and thus the number of harmonics within the gain bandwidth) may be used to set the supply voltage. A sensing circuit may be used to sense the fundamental frequency and supply a signal to the voltage reduction unit to adjust the supply voltage accordingly. The supply voltage may be increased in predetermined steps that are dependant on the band. Moreover, input signals in multiple bands may lead to the same supply voltage being provided to the amplifier stage. For example, if four bands are within the gain bandwidth of the amplifier stage, the voltage reduction unit may provide a first supply voltage for input voltages in the two lowest bands, a second supply voltage for input voltages in the band between the two lowest bands and the highest band, and a third supply voltage for input voltages in the highest band. In addition, this may be accomplished in a single wideband device using a similar sensing and controlling of the supply voltage.

The individual embodiments disclosed may be used in combination as desired. The various types of voltage reduction units in the different embodiments may be used as desired.

It will be understood that the terms and expressions used herein have the ordinary meaning as is accorded to such terms and expressions with respect to their corresponding respective areas of inquiry and study except where specific meanings have otherwise been set forth herein. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Those skilled in the art will recognize that a wide variety of modifications, alterations, and combinations can be made with respect to the above described embodiments without departing from the spirit and scope of the invention defined by the claims, and that such modifications, alterations, and combinations are to be viewed as being within the purview of the inventive concept. Thus, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the claims and all equivalents.

The invention claimed is:

1. A power amplifier comprising:
   a power supply having a power supply voltage;
   an amplifier stage containing a power amplifier device having a breakdown voltage, the power amplifier device having a gain bandwidth that covers multiple frequency bands such that an output voltage of the power amplifier device contains a fundamental component and a harmonic component within the gain bandwidth;
   a voltage reduction unit connected between the power amplifier device and the power supply, the voltage reduction unit limiting the power supply voltage such that an amplifier supply voltage supplied to the power amplifier device to provide power to the power amplifier device is less than a predetermined maximum supply voltage; and
   an impedance matching circuit coupled to an output of the power amplifier device, the impedance matching circuit containing a first matching element corresponding to the harmonic component and a second matching element corresponding to the fundamental component, the first and second matching elements acting in concert with the voltage reduction unit to limit the output voltage of the amplifier stage to a predetermined peak voltage that is less than the breakdown voltage.

2. The power amplifier of claim 1, further comprising a plurality of power amplifier devices, the voltage reduction unit connected between at least one of the power amplifier devices and the power supply.

3. The power amplifier of claim 2, further comprising a plurality of voltage reduction units, each voltage reduction unit connected between one of the power amplifier devices and the power supply.

4. The power amplifier of claim 3, wherein the power amplifier devices are cascaded.

5. The power amplifier of claim 4, wherein at least one of the voltage reduction units is a linear voltage regulator and at least one of the voltage reduction units is a switching regulator.

6. The power amplifier of claim 3, wherein the amplifier stages are disposed in parallel.

7. The power amplifier of claim 1, further comprising matching elements each corresponding to a different harmonic component that is within the gain bandwidth of the power amplifier device.

8. The power amplifier of claim 1, wherein the voltage reduction unit is adjustable.

9. The power amplifier of claim 1, further comprising:
at least one of:
a sensing circuit connected to an input of the power amplifier device, the sensing circuit detecting an input voltage to the power amplifier device and supplying a sensing output in response thereto, or a sensing circuit connected to an output of the power amplifier device, the sensing circuit detecting the output voltage and supplying a sensing output in response thereto; and
an adjuster connected between the sensing circuit and the voltage reduction unit, the adjuster adjusting the maximum supply voltage dependent on the sensing output.

10. The power amplifier of claim 8, further comprising a processor connected with the voltage reduction unit, the processor running a software algorithm to adjust the maximum power supply voltage.

11. The power amplifier of claim 8, wherein the voltage reduction unit contains hardware to adjust the maximum power supply voltage.

12. The power amplifier of claim 8, wherein the voltage reduction unit is an envelope following supply.

13. The power amplifier of claim 1, wherein the voltage reduction unit is a static supply.

14. A method of reducing output voltage of a power amplifier, the method comprising:
supplying a power supply voltage;
providing amplification over multiple frequency bands such that an output voltage contains a fundamental component and a harmonic component within a gain bandwidth of a power amplifier device within an amplifier stage providing the amplification;
limiting the power supply voltage such that an amplifier supply voltage supplied to the power amplifier device to provide power to the power amplifier device is greater less than a predetermined maximum power supply voltage;
providing impedance matching for the output voltage such that the fundamental and harmonic components are independently impedance matched, the impedance matching acting in concert with the limited power supply voltage to limit the output voltage of the power amplifier device to a predetermined peak input voltage that is less than the breakdown voltage.

15. The method of claim 14, further comprising providing at least one of multiple cascaded or multiple parallel amplifications and limiting the power supply voltage to at least one of the power amplifier devices.

16. The method of claim 15, further comprising independently limiting the power supply voltage to each of the power amplifier devices.

17. The method of claim 16, wherein the limiting comprises non-adjustably limiting the power supply voltage to at least one of the power amplifier devices and adjustably limiting the power supply voltage to at least one of the power amplifier devices.

18. The method of claim 14, further comprising:
sensing at least one of the input or output voltage; and
adjusting the limiting dependent on the sensed voltage.

19. The method of claim 14, further comprising:
storing a maximum output voltage;
setting a maximum output voltage of a power supply;
determining a peak output voltage for modulation type of the power amplifier;
limiting the determined peak output voltage to the maximum output voltage;
setting the power supply voltage to a value that does not exceed the maximum output voltage.

20. A power amplifier comprising:
a power supply having a power supply current;
an amplifier stage containing a power amplifier device having a breakdown voltage, the power amplifier device having a gain bandwidth that covers multiple frequency bands such that an output voltage of the amplifier stage contains a fundamental component and a harmonic component within the gain bandwidth;
a voltage reduction unit connected between the power amplifier device and the power supply, the vane reduction unit limiting the power supply voltage such that an amplifier supply voltage supplied to the power amplifier device to provide power to the power amplifier device is less than a predetermined maximum supply voltage that is dependent on the frequency band; and
a current limiting unit connected between the power amplifier device and the power supply, the current limiting unit limiting the power supply current such that a supply current supplied to the power amplifier device to provide power to the power amplifier device is less than a predetermined destructive supply level current, the amplifier supply current limited to the extent that an output current of the amplifier stage is less than a predetermined destructive output current level.

21. The power amplifier of claim 1, further comprising an impedance matching circuit coupled to an output of the power amplifier device, the impedance matching circuit containing a first matching element corresponding to the harmonic component and a second matching element corresponding to the fundamental component, the first and second matching elements acting in concert with the voltage reduction or current limiting unit to limit the output voltage or current of the amplifier stage to a predetermined peak voltage that is less than the breakdown voltage or the output current of the amplifier stage to the predetermined destructive output current level, respectively.

* * * * *

UNITED STATES PATENT AND TRADEMARK OFFICE
CERTIFICATE OF CORRECTION

PATENT NO. : 7,760,027 B2
APPLICATION NO. : 12/117383
DATED : July 20, 2010
INVENTOR(S) : Murji et al.

It is certified that error appears in the above-identified patent and that said Letters Patent is hereby corrected as shown below:

IN THE CLAIMS

1. In Column 11, Lines 59-60, in Claim 14, delete "greater less" and insert -- greater or less --, therefor.

2. In Column 12, Line 36, in Claim 20, delete "vane" and insert -- voltage --, therefor.

Signed and Sealed this
Eighth Day of November, 2011

David J. Kappos
*Director of the United States Patent and Trademark Office*